(12) United States Patent
Fessel

(10) Patent No.: US 11,581,048 B2
(45) Date of Patent: Feb. 14, 2023

(54) METHOD AND SYSTEM FOR VALIDATING ERASURE STATUS OF DATA BLOCKS

(71) Applicant: Cigent Technology, Inc., Fort Myers, FL (US)

(72) Inventor: Tony Edward Fessel, Fort Myers, FL (US)

(73) Assignee: CIGENT TECHNOLOGY, INC., Fort Myers, FL (US)

( * ) Notice: Subject to any disclaimer, the term of this patent is extended or adjusted under 35 U.S.C. 154(b) by 0 days.

(21) Appl. No.: 17/106,320

(22) Filed: Nov. 30, 2020

(65) Prior Publication Data

US 2022/0172792 A1 Jun. 2, 2022

(51) Int. Cl.
*G11C 16/00* (2006.01)
*G11C 16/34* (2006.01)
(Continued)

(52) U.S. Cl.
CPC ...... *G11C 16/3445* (2013.01); *G06F 12/0246* (2013.01); *G11C 16/16* (2013.01)

(58) Field of Classification Search
CPC .............. G06F 12/0246; G06F 12/02; G06F 2212/7204; G06F 11/1433; G06F 11/1441; G06F 12/00; G06F 12/06; G06F 12/0607; G06F 12/08; G06F 12/0802; G06F 12/0866; G06F 12/126; G06F 13/16; G06F 2212/1016; G06F 2212/2022; G06F 2212/312; G06F 2212/7201; G06F 2212/7203; G06F 2212/7205; G06F 2212/7208; G06F 2212/7209; G06F 3/0601; G06F 3/0613; G06F 3/0616; G06F 3/064; G06F 3/0644; G06F 3/0656; G06F 3/0664; G06F 3/0679; G06F 3/068; G11C 16/26; G11C 16/16; G11C 16/32; G11C 16/3445; G11C 16/349; G11C 11/56; G11C 11/5628; G11C 16/0483; G11C 16/08;
(Continued)

(56) References Cited

U.S. PATENT DOCUMENTS 8,924,636 B2  12/2014 Hirao et al.
9,811,415 B2  11/2017 Chu et al.
(Continued)

FOREIGN PATENT DOCUMENTS

KR  20060130013 A * 12/2006 ......... G06F 12/0246
WO  2016/004072 A1  1/2016

OTHER PUBLICATIONS

Notification of Transmittal of the International Search Report (Forms PCT/ISA/220 and PCT/ISA/210) and the Written Opinion of the International Searching Authority (Form PCT/ISA/237) dated Mar. 10, 2022, by the International Application Division Korean Intellectual Property Office in corresponding International Application No. PCT/US2021/059903. (10 pages).

*Primary Examiner* — Thong Q Le
(74) *Attorney, Agent, or Firm* — Panitch Schwarze Belisario & Nadel LLP

(57) ABSTRACT

A method and solid-state storage device are disclosed for validating erasure status of data blocks on a solid-state drive. The method includes assigning each data block of a plurality of data blocks on the solid-state drive, a block identifier and an erasure status, the block identifier being system data, user data, or unmapped data, and the erasure status being erased or not erased.

20 Claims, 3 Drawing Sheets

(51) Int. Cl.
*G06F 12/02* (2006.01)
*G11C 16/16* (2006.01)

(58) Field of Classification Search
CPC ....... G11C 16/10; G11C 16/30; G11C 29/765;
G11C 29/789; G11C 29/82; G11C 8/08
USPC .... 365/185.09, 185.01, 185.11, 200, 189.05,
365/201, 185.03, 230.06
See application file for complete search history.

(56) References Cited

U.S. PATENT DOCUMENTS

2009/0125668 A1    5/2009  Huhne
2018/0189144 A1    7/2018  Song et al.
2018/0286485 A1  10/2018  Takizawa et al.
2020/0082891 A1*  3/2020  Lee .................... G06F 12/0246

* cited by examiner

METHOD AND SYSTEM FOR VALIDATING ERASURE STATUS OF DATA BLOCKS

FIELD

The present disclosure generally relates to a method and system for validating erasure status of data blocks, and more particularly to method and system method for validating erasure status of data blocks in a solid-state storage device by assigning each data block of a plurality of data blocks a block identifier and an erasure status.

BACKGROUND

A solid-state drive (SSD) is a solid-state storage device that uses integrated circuit assemblies to store date, for example, using flash member. A solid-state drive (SSD) includes a high-speed interface connected to a controller chip and a plurality of storage, or memory, elements. The controller chip translates a high speed protocol received over the high speed interface into the protocol required by the storage elements, which include solid-state memory devices (for example, semiconductor devices). The controller controls the occurrence of read and erase events in the storage elements. The storage elements in the SSD comprise a plurality of blocks, which are the smallest erasable units in the memory. The blocks are subdivided into pages, which are the smallest readable units of the memory, and pages are subdivided into sectors. Each of the sectors, for example, has at least 512 bytes. In addition, each byte generally have 8 consecutive bits. In program and erase cycles (or write and erase), all the pages in a block are erased and then some, if not all, of the pages in the block are subsequently programmed (e.g., written with data).

Solid-state drives can have reliability issues as a result, for example, relatively high gate voltages applied to the storage elements during program and erase cycles, which can cause cumulative permanent changes to the storage element characteristics. For example, a charge may become trapped in the gate oxide of the storage elements through stress-induced leakage current (SILC). As the charge accumulates, the effect of programming or erasing a storage element becomes less reliable and the overall endurance of the storage element decreases. Accordingly, methods to prolong the SSD can include, for example, distributing the program and erase cycling equally among all storage elements in the SSD so that all storage elements wear at similar rates.

In addition, there is also an industry concern, particularly in government and other security conscious spaces, over the ability (or inability) to securely erase a solid-state storage device (SSD). For example, there has been a history of manufacturers not properly overwriting data when explicitly instructed to do so through firmware based secure erase/sanitization commands as well as incomplete erasures as a result of improper overwrites coupled with a lack of consideration for over-provisioned areas. Thus, there is a need for a method and system that validates the erasure status of each data block on the solid-state drive (SSD).

SUMMARY

In accordance with an aspect, a method is disclosed for validating erasure status of data blocks in a solid-state storage device, the method comprising: assigning each data block of a plurality of data blocks on a solid-state drive, a block identifier and an erasure status, the block identifier being system data, user data, or unmapped data, and the erasure status being erased or not erased.

In accordance with another aspect, a solid-state storage device is disclosed, the device comprising: a solid-state drive including a controller and a plurality of data blocks; and a processor configured to assign each data block of the plurality of data blocks, a block identifier and an erasure status, the block identifier being system data, user data, or unmapped data, and the erasure status being erased or not erased.

BRIEF DESCRIPTION OF THE DRAWING FIGURES

The scope of the present disclosure is best understood from the following detailed description of exemplary embodiments when read in conjunction with the accompanying drawings. Included in the drawings are the following figures.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION

System for Validating Erasure Status of Data Blocks

Figure 1:
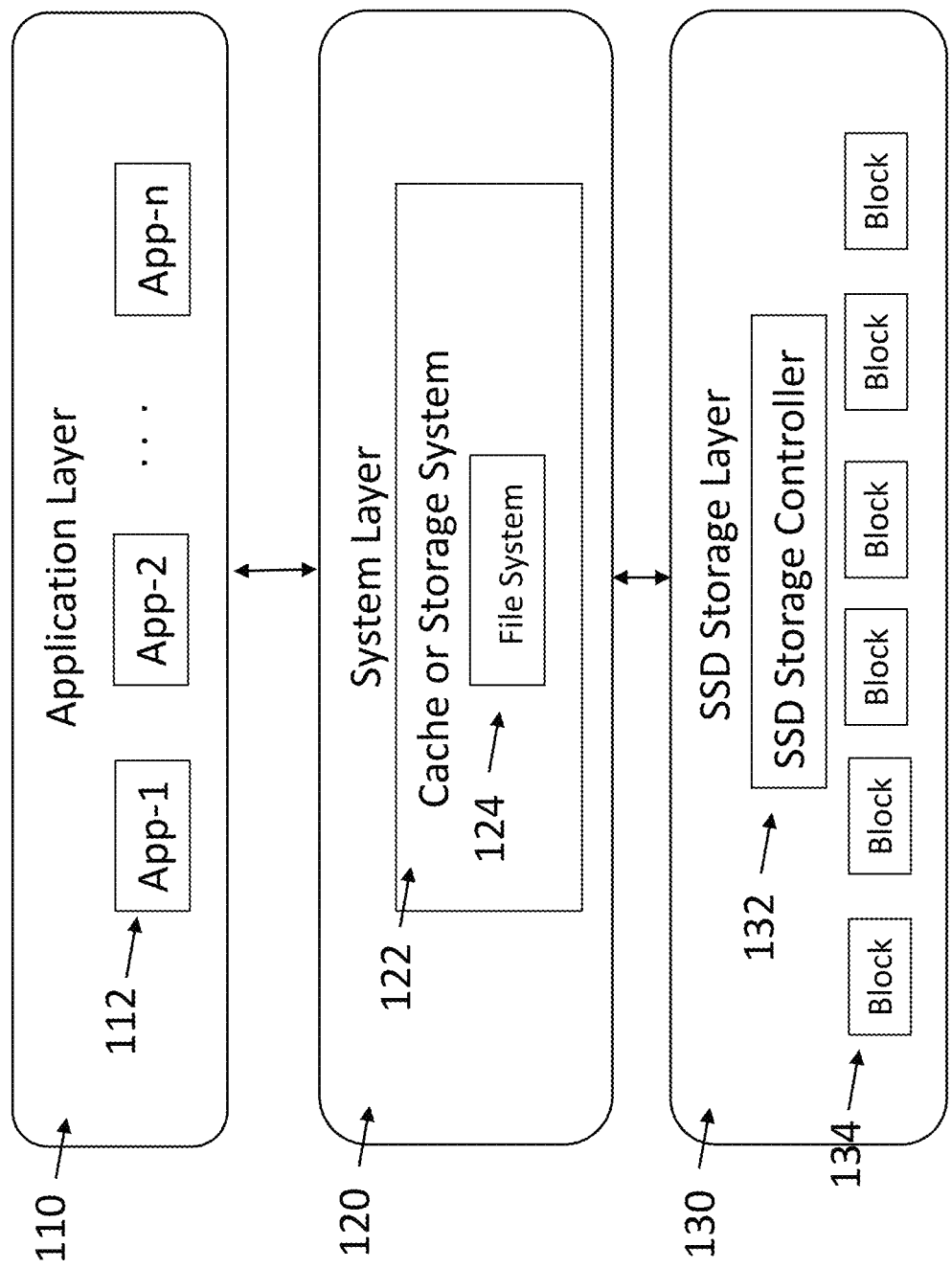
FIG. 1 is a block diagram illustrating a high level architecture of a solid-state storage device configured to validate erasure status of data blocks in accordance with exemplary embodiments.

FIG. 1 illustrates an embodiment of a solid-state storage device 100. It will be apparent to persons having skill in the relevant art that the embodiment of the solid-state storage device 100 illustrated in FIG. 1 is provided as illustration only and may not be exhaustive to all possible configurations of the solid-state storage device 100 suitable for performing the functions as discussed herein. For example, the computer system 300 illustrated in FIG. 3 and discussed in more detail below may be a suitable configuration of the solid-state storage device 100.

In accordance with an exemplary embodiment, the solid-state storage device 100 can include an application layer 110, a system layer 120, and a SSD storage layer 130 (e.g., SSD). The application layer 110 communicates with the system layer 120, and the communication may occur through, for example, a central processing unit (CPU) of a computing device. The system layer 120 is in communication with the SSD storage layer 130, and the communication may occur through, for example, a Peripheral Component Interconnect Express (PCIe) interface.

The application layer 110 can include a plurality of applications 112 (e.g., App-1, App-2, . . . App-n), which can include, for example, software or programs capable of accessing media, data, and content, when executed by the CPU or other processor.

The system layer 120 may be, for example, an operating system (OS) that manages computer hardware resources and provides common services for application software. The system layer 120 may represent an operating system such as Microsoft Windows, and Linux. As shown in FIG. 1, the system layer 120 includes a file system 124 configured to issue a write command to, for example, a solid-state drive controller 132.

In accordance with an embodiment, the system layer 120 may also include or support a cache or storage system 122 for content. In an embodiment, the cache or storage system 122, can be, for example, a static random-access memory (SRAM) or another type of memory. While the file system 124 is depicted within the cache or storage system 122 in FIG. 1, the file system 124 may be otherwise located or configured. For example, the file system 124 may be found on a network server or accessed through a distributed system. The SSD storage layer 130 includes an SSD controller 132 and a plurality of erasable data blocks 134. The SSD controller 132 is configured to receive, for example, the write command issued by the file system 124 of the system layer 120. Each of the erasable data blocks 134 in FIG. 1 is configured to store pages of data or content. For example, an erasable data block 134 is generally considered the minimum unit, for example, in NAND flash memory that can be erased at one time.

Process for Validating Erasure Status of Data Blocks

Figure 2:
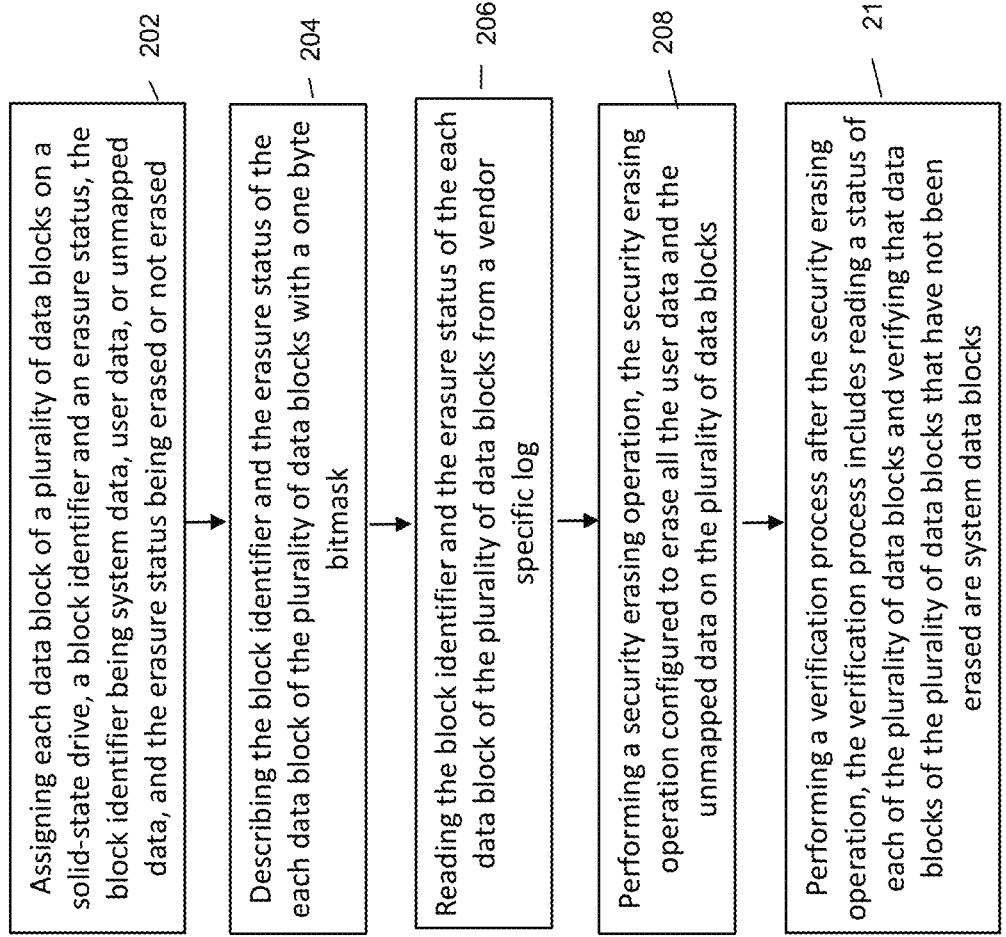
FIG. 2 is a flow diagram illustrating a process for validating erasure status of data blocks as executed by the solid-state storage device in FIG. 1 in accordance with exemplary embodiments.

In accordance with an exemplary embodiment, a method is disclosed for validating the erasure status of data blocks in a solid-state storage device. As shown in FIG. 2, in step 202, each data block of a plurality of data blocks on a solid-state drive is assigned, a block identifier and an erasure status. The block identifier being system data, user data, or unmapped data, and the erasure status being erased or not erased. In step 204, the block identifier and the erasure status of the each data block of the plurality of data blocks can be described with a one byte bitmask. In step 206, the block identifier and the erasure status of the each data block of the plurality of data blocks can be read from a vendor specific log. In step 208, a security erasing operation can be performed, the security erasing operation configured to erase all the user data and the unmapped data on the plurality of data blocks. In step 210, a verification process after the security erasing operation can be performed, the verification process includes reading a status of each of the plurality of data blocks and verifying that data blocks of the plurality of data blocks that have not been erased are system data blocks.

In accordance with an embodiment, as disclosed above, each block will be an erasable block that will be assigned a block identifier (e.g., type) and an erasure status (erased or not erased). For example, the block identifier (or types) of the blocks can include: system data, user data, and unmapped data. The system data can be, for example, the blocks that contain SSD system data. The user data can be the blocks that contain data stored by the user, and the unmapped data can be temporary blocks for firmware management, and wherein the temporary blocks were either a system data block or a user data block. For example, as described above, data can be written to one or more of the plurality of data blocks with a controller.

In accordance with an exemplary embodiment, the following table describes, for example, an exemplary block status bitmask as set forth above in step 204:

| BLOCK STATUS BITS | | | | | | | |
|---|---|---|---|---|---|---|---|
| Bit 7 | Bit 6 | Bit 5 | Bit 4 | Bit 3 | Bit 2 | Bit 1 | Bit 0 |
| Rsvd | Type: Unmapped | Type: System Data | Type: User | Rsvd | Rsvd | State: Not Erased | State: Erased |

In accordance with an exemplary embodiment, all user and unmapped data types are expected to be erased following a security erase operation. In addition, the verification process will include reading the status of all blocks and verifying that the only "not erased" blocks are system data type blocks.

In accordance with an exemplary embodiment, the command log can be accessed by the host system through a replay protected vendor interface. The log retrieval process can include, the host software preparing the request command (including replay protection) and sending the request to the solid-state drive. The solid-state drive receives the command and validates the replay protection data. If the replay protection data cannot be validated, the command fails. Alternatively, if the replay protection data is validated, the solid-state drive responds by sending the log back to the host.

In accordance with an embodiment, the following source code illustrates a process by which the erasure status of the drive can be confirmed and the block statistics can be tallied.

```
enum BlockStatus: uint8_t
{
    USER_NOT_ERASED=0x12,
    USER_ERASED=0x11,
    FW_NOT_ERASED=0x22,
    FW_ERASED=0x21,
    UNMAP_NOT_ERASED=0x42,
    UNMAP_ERASED=0x41
};
inline constexpr uint32_t ERASE_LOG_LEN=8192;
using EraseLog=std::array<uint8_t, ERASE_LOG_LEN>;
struct EraseVerifyStats
{
    uint32_t userNotErased{0};
    uint32_t userErased{0};
    uint32_t fwNotErased{0};
    uint32_t fwErased{0};
    uint32_t unmappedNotErased{0};
    uint32 t unmappedErased{0};
};
bool eraseVerifyLogStats(const EraseLog &log, EraseVerifyStats &stats)
{
    stats=EraseVerifyStats( );
    for(const auto &val: log)
    {
        switch (val)
        {
        case BlockStatus::USER_ERASED:
            ++stats.userErased;
            break;
        case BlockStatus::USER_NOT_ERASED:
            ++stats.userNotErased;
            break;
        case BlockStatus::FW_ERASED:
            ++stats.fwErased;
            break;
```

```
case BlockStatus::FW_NOT_ERASED:
   ++stats.fwNotErased;
   break;
case BlockStatus::UNMAP_ERASED:
   ++stats.unmappedErased;
   break;
case BlockStatus::UNMAP_NOT_ERASED:
   ++stats.unmappedNotErased;
   break;
      }
   }
   return !stats.userNotErased && !stats.unmapped-
      NotErased;
}
```

A sample output from a command line utility is shown below. For example, different solid-state drives will have different block counts, and the end of the block status information can be marked by 0xFF. As such, the block output is cut off after the first 0xFF is encountered.

| ERASE LOG BLOCKS | | | | | | | | | | | | | | | |
| --- | --- | --- | --- | --- | --- | --- | --- | --- | --- | --- | --- | --- | --- | --- | --- |
| 00 | 01 | 03 | 04 | 05 | 06 | 07 | 08 | 09 | 10 | 11 | 12 | 13 | 14 | 15 | 16 |
| 000000 | 22 | 22 | 22 | 22 | 22 | 22 | 22 | 22 | 22 | 22 | 42 | 42 | 42 | 42 | 42 | 42 |
| 000016 | 42 | 42 | 22 | 42 | 42 | 42 | 42 | 42 | 42 | 42 | 42 | 42 | 42 | 42 | 42 | 42 |
| 000032 | 22 | 42 | 22 | 22 | 22 | 22 | 12 | 22 | 22 | 42 | 42 | 42 | 42 | 42 | 42 | 42 |
| 000048 | 42 | 42 | 42 | 42 | 42 | 42 | 42 | 42 | 42 | 42 | 42 | 42 | 42 | 42 | 42 | 42 |
| 000064 | 42 | 42 | 42 | 42 | 42 | 42 | 42 | 42 | 42 | 42 | 42 | 42 | 42 | 42 | 42 | 42 |
| 000080 | 42 | 42 | 42 | 42 | 42 | 42 | 42 | 42 | 42 | 42 | 42 | 42 | 42 | 42 | 42 | 42 |
| 000096 | 42 | 42 | 42 | 42 | 42 | 42 | 42 | 42 | 42 | 42 | 42 | 42 | 42 | 42 | 42 | 42 |
| 000112 | 42 | 42 | 42 | 42 | 42 | 42 | 42 | 42 | 42 | 42 | 42 | 42 | 42 | 42 | 42 | 42 |
| 000128 | 42 | 42 | 42 | 42 | 42 | 42 | 42 | 42 | 42 | 42 | 42 | 42 | 42 | 42 | 42 | 42 |
| 000144 | 42 | 42 | 42 | 42 | 42 | 42 | 42 | 42 | 42 | 42 | 42 | 42 | 42 | 42 | 42 | 42 |
| 000160 | 42 | 42 | 42 | 42 | 42 | 42 | 42 | 42 | 42 | 42 | 42 | 42 | 42 | 42 | 42 | 42 |
| 000176 | 42 | 42 | 42 | 42 | 42 | 42 | 42 | 42 | 42 | 42 | 42 | 42 | 42 | 42 | 42 | 42 |
| 000192 | 42 | 42 | 42 | 42 | 42 | 42 | 42 | 42 | 42 | 42 | 42 | 42 | 42 | 42 | 42 | 42 |
| 000208 | 42 | 42 | 42 | 42 | 42 | 42 | 42 | 42 | 42 | 42 | 42 | 42 | 42 | 42 | 42 | 42 |
| 000224 | 42 | 42 | 42 | 42 | 42 | 42 | 42 | 42 | 42 | 42 | 42 | 42 | 42 | 42 | 42 | 42 |
| 000240 | 42 | 42 | 42 | 42 | 42 | 42 | 42 | 42 | 42 | 42 | 42 | 42 | 42 | 42 | 42 | 42 |
| 000256 | 42 | 42 | 42 | 42 | 42 | 42 | 42 | 42 | 42 | 42 | 42 | 42 | 42 | 42 | 42 | 42 |
| 000272 | 42 | 42 | 42 | 42 | 42 | 42 | 42 | 42 | 42 | 42 | 42 | 42 | 42 | 42 | 42 | 42 |
| 000288 | 42 | 42 | 42 | 42 | 42 | 42 | 42 | 42 | 42 | 42 | 42 | 42 | 42 | 42 | 42 | 42 |
| 000304 | 42 | 42 | 42 | 42 | 42 | 42 | 42 | 42 | 42 | 42 | 42 | 42 | 42 | 42 | 42 | 42 |
| 000320 | 42 | 42 | 42 | 42 | 42 | 42 | 42 | 42 | 42 | 42 | 42 | 42 | 42 | 42 | 42 | 42 |
| 000336 | 42 | 42 | 42 | 42 | 42 | 42 | 42 | 42 | 42 | 42 | 42 | 42 | 42 | 42 | 42 | 42 |
| 000352 | 42 | 42 | 42 | 42 | 42 | 42 | 42 | 42 | 42 | 42 | 42 | 42 | 42 | 42 | 42 | 42 |
| 000368 | 42 | 42 | 42 | 42 | 42 | 42 | 42 | 42 | 42 | 42 | 42 | 42 | 42 | 42 | 42 | 42 |
| 000384 | 42 | 42 | 42 | 42 | 42 | 42 | 42 | 42 | 42 | 42 | 42 | 42 | 42 | 42 | 42 | 42 |
| 000400 | 42 | 42 | 42 | 42 | 42 | 42 | 42 | 42 | 42 | 42 | 42 | 42 | 42 | 42 | 42 | 42 |
| 000416 | 42 | 42 | 42 | 42 | 42 | 42 | 42 | 42 | 42 | 42 | 42 | 42 | 42 | 42 | 42 | 42 |
| 000432 | 42 | 42 | 42 | 42 | 42 | 42 | 42 | 42 | 42 | 42 | 42 | 42 | 42 | 42 | 42 | 42 |
| 000448 | 42 | 42 | 42 | 42 | 42 | 42 | 42 | 42 | 42 | 42 | 42 | 42 | 42 | 42 | 42 | 42 |
| 000464 | 42 | 42 | 42 | 42 | 42 | 42 | 42 | 42 | 42 | 42 | 42 | 42 | 42 | 42 | 42 | 42 |
| 000480 | 42 | 42 | 42 | 42 | 42 | 42 | 42 | 42 | 42 | 42 | 42 | 42 | 42 | 42 | 42 | 42 |
| 000496 | 42 | 42 | 42 | 42 | 42 | 42 | 42 | 42 | 42 | 42 | 42 | 42 | 42 | 42 | 42 | 42 |
| 000512 | 42 | 42 | 42 | 42 | 42 | 42 | 42 | 42 | 42 | 42 | 42 | 42 | 42 | 42 | 42 | 42 |
| 000528 | 42 | 42 | 42 | 42 | 42 | 42 | 42 | 42 | 42 | 42 | 42 | 42 | 42 | 42 | 42 | 42 |
| 000544 | 42 | 42 | 42 | 42 | 42 | 42 | 42 | 42 | 42 | 42 | 42 | 42 | 42 | 42 | 42 | 42 |
| 000560 | 42 | 42 | 42 | 42 | 42 | 42 | 42 | 42 | 42 | 42 | 42 | 42 | 42 | 42 | 42 | 42 |
| 000576 | 42 | 42 | 42 | 42 | 42 | 42 | 42 | 42 | 42 | 42 | 42 | 42 | 42 | 42 | 42 | 42 |
| 000592 | 42 | 42 | 42 | 42 | 42 | 42 | 42 | 42 | 42 | 42 | 42 | 42 | 42 | 42 | 42 | 42 |
| 000608 | 42 | 42 | 42 | 42 | 42 | 42 | 42 | 42 | 42 | 42 | 42 | 42 | 42 | 42 | 42 | 42 |
| 000624 | 42 | 42 | 42 | 42 | 42 | 42 | 42 | 42 | 42 | 42 | 42 | 42 | 42 | 42 | 42 | 42 |
| 000640 | 42 | 42 | 42 | 42 | 42 | 42 | 42 | 42 | 42 | 02 | 42 | 42 | 42 | 42 | 42 | 42 |
| 000656 | 42 | 42 | 42 | 42 | 42 | 42 | 42 | 42 | 42 | 42 | 42 | 42 | 42 | 42 | 42 | 42 |
| 000672 | 42 | 42 | 42 | 42 | 42 | 42 | 42 | 42 | 42 | 42 | 42 | 42 | 42 | 42 | 42 | 42 |
| 000688 | 42 | 42 | 42 | 42 | 42 | 42 | 42 | 42 | 42 | 42 | 42 | 42 | 42 | 42 | 42 | 42 |
| 000704 | 42 | 42 | 42 | 42 | 42 | 42 | 42 | 42 | 42 | 42 | 42 | 42 | 42 | 42 | 42 | 42 |
| 000720 | 42 | 42 | 42 | 42 | 42 | 42 | 42 | 42 | 42 | 42 | 42 | 42 | 42 | 42 | 42 | 42 |
| 000736 | 42 | 42 | 42 | 42 | 42 | 42 | 42 | 42 | 10 | 42 | 42 | 42 | 42 | 42 | 42 | 42 |
| 000752 | 42 | 42 | 42 | 42 | 42 | 42 | 42 | 42 | 42 | 42 | 42 | 42 | 42 | 42 | 42 | 42 |
| 000768 | 42 | 42 | 42 | 42 | 42 | 42 | 42 | 42 | 42 | 42 | 42 | 42 | 42 | 42 | 42 | 42 |
| 000784 | 42 | 42 | 42 | 42 | 42 | 42 | 42 | 42 | 42 | 42 | 42 | 42 | 42 | 42 | 42 | 42 |
| 000800 | 42 | 42 | 42 | 42 | 42 | 42 | 42 | 42 | 42 | 42 | 42 | 42 | 42 | 42 | 42 | 42 |
| 000816 | 42 | 42 | 42 | 42 | 42 | 42 | 42 | 42 | 42 | 42 | 42 | 42 | 42 | 42 | 42 | 42 |
| 000832 | 42 | 42 | 42 | 42 | 42 | 42 | 42 | 42 | 42 | 42 | 42 | 42 | 42 | 42 | 42 | 42 |
| 000848 | 42 | 42 | 42 | 42 | 42 | 42 | 42 | 42 | 42 | 42 | 42 | 42 | 42 | 42 | 42 | 42 |
| 000864 | 42 | 42 | 42 | 42 | 42 | 42 | 42 | 42 | 42 | 42 | 42 | 42 | 42 | 42 | 42 | 42 |
| 000880 | 42 | 42 | 42 | 42 | 42 | 42 | 42 | 42 | 42 | 42 | 42 | 42 | 42 | 42 | 42 | 42 |
| 000896 | 42 | 42 | 42 | 42 | 42 | 42 | 42 | 42 | 42 | 42 | 42 | 42 | 42 | 42 | 42 | 42 |

-continued

| ERASE LOG BLOCKS | | | | | | | | | | | | | | | | |
|---|---|---|---|---|---|---|---|---|---|---|---|---|---|---|---|---|
| | 00 | 01 | 03 | 04 | 05 | 06 | 07 | 08 | 09 | 10 | 11 | 12 | 13 | 14 | 15 | 16 |
| 000912 | 42 | 42 | 42 | 42 | 42 | 42 | 42 | 42 | 42 | 42 | 42 | 42 | 42 | 42 | 42 | 42 |
| 000928 | 42 | 42 | 42 | 42 | 42 | 42 | 42 | 42 | 42 | 42 | 42 | 42 | 42 | 42 | 42 | 42 |
| 000944 | 42 | 42 | 42 | 42 | 42 | 42 | 42 | 42 | 42 | 42 | 42 | 42 | 42 | 42 | 42 | 42 |
| 000960 | 42 | 42 | 42 | 42 | 42 | 42 | 42 | 42 | 42 | 42 | 42 | 42 | 42 | 42 | 42 | 42 |
| 000976 | 42 | 42 | 42 | 42 | 42 | 42 | 42 | 42 | 42 | 42 | 42 | 42 | 42 | 42 | 42 | FF |

BLOCK STATISTICS
[0×12] User::Not Erased!: 1
[0×11] User::Erased: 0
[0×22] Firmware::Not Erased: 18
[0×21] Firmware::Erased: 0
[0×42] Unmapped::Not Erased!: 971
[0×41] Unmapped::Erased: 0
ERASURE STATUS: Drive not erased!

In accordance with an exemplary embodiment, the disclosed method and system provides the additional benefit of data erasure verification without requiring that the data be read from the device into a host system/software suite. In addition, the method and system provides a dramatic improvement in both the security of the operation (less concern over unauthorized users accessing data) and the speed of the verification operation.

Computer System Architecture

Figure 3:
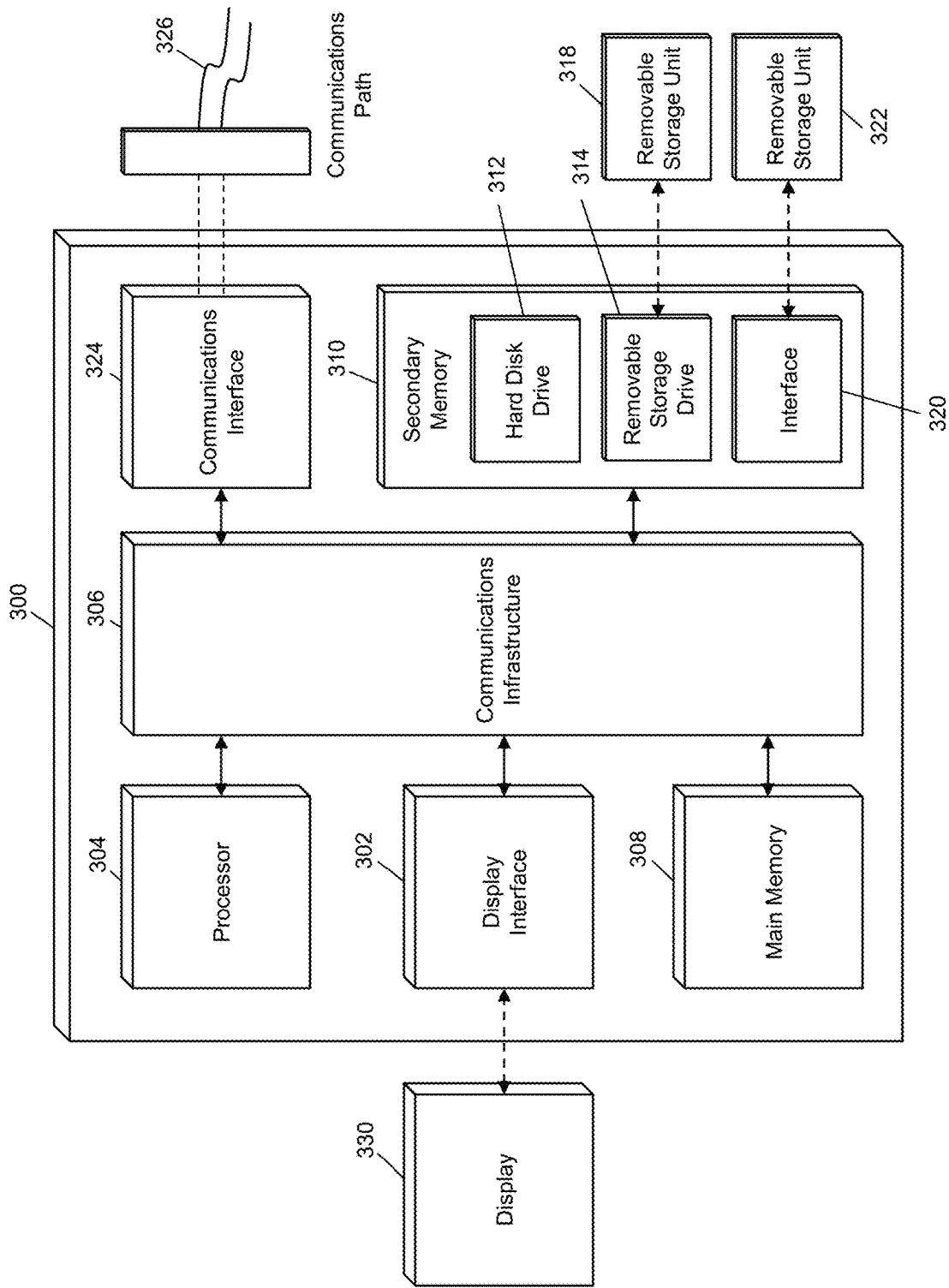
FIG. 3 is a block diagram illustrating a computer system architecture in accordance with exemplary embodiments.

FIG. 3 illustrates a computer system 300 in which embodiments of the present disclosure, or portions thereof, may be implemented as computer-readable code. For example, the solid-state storage device 100 of FIG. 1 may be implemented in the computer system 300 using hardware, software, firmware, non-transitory computer readable media having instructions stored thereon, or a combination thereof and may be implemented in one or more computer systems or other processing systems. Hardware, software, or any combination thereof may embody modules and components used to implement the method of FIG. 2.

If programmable logic is used, such logic may execute on a commercially available processing platform configured by executable software code to become a specific purpose computer or a special purpose device (e.g., programmable logic array, application-specific integrated circuit, etc.). A person having ordinary skill in the art may appreciate that embodiments of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device. For instance, at least one processor device and a memory may be used to implement the above described embodiments.

A processor unit or device as discussed herein may be a single processor, a plurality of processors, or combinations thereof. Processor devices may have one or more processor "cores." The terms "computer program medium," "non-transitory computer readable medium," and "computer usable medium" as discussed herein are used to generally refer to tangible media such as a removable storage unit 318, a removable storage unit 322, and a hard disk installed in hard disk drive 312.

Various embodiments of the present disclosure are described in terms of this example computer system 300. After reading this description, it will become apparent to a person skilled in the relevant art how to implement the present disclosure using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

Processor device 304 may be a special purpose or a general purpose processor device specifically configured to perform the functions discussed herein. The processor device 304 may be connected to a communications infrastructure 306, such as a bus, message queue, network, multi-core message-passing scheme, etc. The network may be any network suitable for performing the functions as disclosed herein and may include a local area network (LAN), a wide area network (WAN), a wireless network (e.g., WiFi), a mobile communication network, a satellite network, the Internet, fiber optic, coaxial cable, infrared, radio frequency (RF), or any combination thereof. Other suitable network types and configurations will be apparent to persons having skill in the relevant art. The computer system 300 may also include a main memory 308 (e.g., random access memory, read-only memory, etc.), and may also include a secondary memory 310. The secondary memory 310 may include the hard disk drive 312 and a removable storage drive 314, such as a floppy disk drive, a magnetic tape drive, an optical disk drive, a flash memory, etc.

The removable storage drive 314 may read from and/or write to the removable storage unit 318 in a known manner. The removable storage unit 318 may include a removable storage media that may be read by and written to by the removable storage drive 314. For example, if the removable storage drive 314 is a floppy disk drive or universal serial bus port, the removable storage unit 318 may be a floppy disk or portable flash drive, respectively. In one embodiment, the removable storage unit 318 may be non-transitory computer readable recording media.

In some embodiments, the secondary memory 310 may include alternative means for allowing computer programs or other instructions to be loaded into the computer system 300, for example, the removable storage unit 322 and an interface 320. Examples of such means may include a program cartridge and cartridge interface (e.g., as found in video game systems), a removable memory chip (e.g., EEPROM, PROM, etc.) and associated socket, and other removable storage units 322 and interfaces 320 as will be apparent to persons having skill in the relevant art.

Data stored in the computer system 300 (e.g., in the main memory 308 and/or the secondary memory 310) may be stored on any type of suitable computer readable media, such as optical storage (e.g., a compact disc, digital versatile disc, Blu-ray disc, etc.) or magnetic tape storage (e.g., a hard disk drive). The data may be configured in any type of suitable database configuration, such as a relational database, a structured query language (SQL) database, a distributed database, an object database, etc. Suitable configurations and storage types will be apparent to persons having skill in the relevant art.

The computer system 300 may also include a communications interface 324. The communications interface 324 may be configured to allow software and data to be transferred between the computer system 300 and external devices. Exemplary communications interfaces 324 may include a modem, a network interface (e.g., an Ethernet card), a communications port, a PCMCIA slot and card, etc. Software and data transferred via the communications interface 324 may be in the form of signals, which may be electronic, electromagnetic, optical, or other signals as will be apparent to persons having skill in the relevant art. The signals may travel via a communications path 326, which may be configured to carry the signals and may be implemented using wire, cable, fiber optics, a phone line, a cellular phone link, a radio frequency link, etc.

The computer system 300 may further include a display interface 302. The display interface 302 may be configured to allow data to be transferred between the computer system 300 and external display 330. Exemplary display interfaces 302 may include high-definition multimedia interface (HDMI), digital visual interface (DVI), video graphics array (VGA), etc. The display 330 may be any suitable type of display for displaying data transmitted via the display interface 302 of the computer system 300, including a cathode ray tube (CRT) display, liquid crystal display (LCD), light-emitting diode (LED) display, capacitive touch display, thin-film transistor (TFT) display, etc.

Computer program medium and computer usable medium may refer to memories, such as the main memory 308 and secondary memory 310, which may be memory semiconductors (e.g., DRAMs, etc.). These computer program products may be means for providing software to the computer system 300. Computer programs (e.g., computer control logic) may be stored in the main memory 308 and/or the secondary memory 310. Computer programs may also be received via the communications interface 324. Such computer programs, when executed, may enable computer system 300 to implement the present methods as discussed herein. In particular, the computer programs, when executed, may enable processor device 304 to implement the methods illustrated by FIG. 2, as discussed herein. Accordingly, such computer programs may represent controllers of the computer system 300. Where the present disclosure is implemented using software, the software may be stored in a computer program product and loaded into the computer system 300 using the removable storage drive 314, interface 320, and hard disk drive 312, or communications interface 324.

The processor device 304 may comprise one or more modules or engines configured to perform the functions of the computer system 300. Each of the modules or engines may be implemented using hardware and, in some instances, may also utilize software, such as corresponding to program code and/or programs stored in the main memory 308 or secondary memory 310. In such instances, program code may be compiled by the processor device 304 (e.g., by a compiling module or engine) prior to execution by the hardware of the computer system 300. For example, the program code may be source code written in a programming language that is translated into a lower level language, such as assembly language or machine code, for execution by the processor device 304 and/or any additional hardware components of the computer system 300. The process of compiling may include the use of lexical analysis, preprocessing, parsing, semantic analysis, syntax-directed translation, code generation, code optimization, and any other techniques that may be suitable for translation of program code into a lower level language suitable for controlling the computer system 300 to perform the functions disclosed herein. It will be apparent to persons having skill in the relevant art that such processes result in the computer system 300 being a specially configured computer system 300 uniquely programmed to perform the functions discussed above.

Techniques consistent with the present disclosure provide, among other features, systems and methods for validating erasure status of data blocks. While various exemplary embodiments of the disclosed system and method have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. A method for validating erasure status of data blocks in a solid-state storage device, the method comprising:
assigning each data block of a plurality of data blocks on a solid-state drive, a block identifier and an erasure status, the block identifier being system data, user data, or unmapped data, and the erasure status being erased or not erased.

2. A method for validating erasure status of data blocks in a solid-state storage device, the method comprising:
assigning each data block of a plurality of data blocks on a solid-state drive, a block identifier and an erasure status, the block identifier being system data, user data, or unmapped data, and the erasure status being erased or not erased; and
describing the block identifier and the erasure status of the each data block of the plurality of data blocks with a one byte bitmask.

3. The method according to claim 2, further comprising:
reading the block identifier and the erasure status of the each data block of the plurality of data blocks from a vendor specific log.

4. The method according to claim 3, further comprising:
performing a security erasing operation, the security erasing operation configured to erase all the user data and the unmapped data on the plurality of data blocks.

5. The method according to claim 4, further comprising:
performing a verification process after the security erasing operation, the verification process includes reading a status of each of the plurality of data blocks and verifying that data blocks of the plurality of data blocks that have not been erased are system data blocks.

6. A method for validating erasure status of data blocks in a solid-state storage device, the method comprising:
assigning each data block of a plurality of data blocks on a solid-state drive, a block identifier and an erasure status, the block identifier being system data, user data, or unmapped data, and the erasure status being erased or not erased, wherein the system data is a data block that contains solid-state drive data, the user data is a data block that contains data stored by a user, and the unmapped data is a data block that is a temporary block for firmware management, and wherein the temporary block for firmware management previously contained either system data or user data.

7. The method according to claim 1, wherein the each data block of the plurality of data blocks are erasable data blocks.

8. The method according to claim 1, further comprising: writing data to one or more of the plurality of data blocks with a controller.

9. The method according to claim 1, wherein the verification process does not require that data on the plurality of data blocks be read from the solid-state storage device into a host system or software suite.

10. The method according to claim 1, wherein the solid-state storage device is a computing device.

11. A solid-state storage device, the device comprising:
a solid-state drive including a controller and a plurality of data blocks; and
a processor configured to assign each data block of the plurality of data blocks, a block identifier and an erasure status, the block identifier being system data, user data, or unmapped data, and the erasure status being erased or not erased.

12. A solid-state storage device, the device comprising:
a solid-state drive including a controller and a plurality of data blocks; and
a processor configured to assign each data block of the plurality of data blocks, a block identifier and an erasure status, the block identifier being system data, user data, or unmapped data, and the erasure status being erased or not erased, wherein the block identifier and the erasure status of the each data block of the plurality of data blocks is described with a one byte bitmask.

13. The device according to claim 12, wherein the processor is configured to:
read the block identifier and the erasure status of the each data block of the plurality of data blocks from a vendor specific log.

14. The device according to claim 13, wherein the processor is configured to:
perform a security erasing operation, the security erasing operation configured to erase all the user data and the unmapped data on the plurality of data blocks.

15. The device according to claim 14, wherein the processor is configured to:
perform a verification process after the security erasing operation, the verification process including reading a status of each of the plurality of data blocks and verifying that data blocks of the plurality of data blocks that have not been erased are system data blocks.

16. A solid-state storage device, the device comprising:
a solid-state drive including a controller and a plurality of data blocks; and
a processor configured to assign each data block of the plurality of data blocks, a block identifier and an erasure status, the block identifier being system data, user data, or unmapped data, and the erasure status being erased or not erased, wherein the system data is a data block that contains solid-state drive data, the user data is a data block that contains data stored by a user, and the unmapped data is a data block that is a temporary block for firmware management, and wherein the temporary block for firmware management previously contained either system data or user data.

17. The device according to claim 11, wherein the each data block of the plurality of data blocks are erasable data blocks.

18. The device according to claim 11, wherein the controller is configured to:
write data to one or more of the plurality of data blocks with a controller.

19. The device according to claim 11, wherein the verification process does not require that data on the plurality of data blocks be read from the solid-state storage device into a host system or software suite.

20. The device according to claim 11, wherein the solid-state storage device is a computing device.

* * * * *